(12) United States Patent
Bandyopadhyay et al.

(10) Patent No.: US 6,208,015 B1
(45) Date of Patent: Mar. 27, 2001

(54) INTERLEVEL DIELECTRIC WITH AIR GAPS TO LESSEN CAPACITIVE COUPLING

(75) Inventors: Basab Bandyopadhyay; H. Jim Fulford, Jr.; Robert Dawson; Fred N. Hause; Mark W. Michael; William S. Brennan, all of Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/014,192

(22) Filed: Jan. 27, 1998

Related U.S. Application Data

(62) Division of application No. 08/658,456, filed on Jun. 5, 1996.

(51) Int. Cl.$^7$ .................................................. H01L 23/58
(52) U.S. Cl. .......................... 257/635; 257/637; 257/758
(58) Field of Search ................................... 257/637, 641, 257/758, 635, 636

(56) References Cited

U.S. PATENT DOCUMENTS

| | | | |
|---|---|---|---|
| 4,182,023 | 1/1980 | Cohen et al. | 438/301 |
| 4,675,074 | 6/1987 | Wada et al. | 438/40 |
| 4,681,655 | 7/1987 | Potter | 156/632 |
| 4,899,439 | 2/1990 | Potter et al. | 29/846 |
| 4,920,639 | 5/1990 | Yee | 174/261 |
| 5,000,818 | 3/1991 | Thomas et al. | 156/643 |
| 5,001,079 | 3/1991 | Van Laarhoven et al. | 438/666 |
| 5,117,276 | 5/1992 | Thomas et al. | 257/758 |
| 5,141,896 | 8/1992 | Katoh | 438/619 |
| 5,182,225 | 1/1993 | Matthews | 438/202 |
| 5,217,926 | 6/1993 | Langley | 438/699 |
| 5,241,193 | 8/1993 | Pfiester et al. | 257/67 |
| 5,272,100 | 12/1993 | Satoh | 438/305 |
| 5,310,700 | 5/1994 | Lien et al. | 438/658 |
| 5,324,683 | 6/1994 | Fitch et al. | 438/422 |
| 5,386,142 | 1/1995 | Kurtz et al. | 257/508 |
| 5,393,709 | 2/1995 | Lur et al. | 438/624 |
| 5,407,860 | 4/1995 | Stoltz et al. | 438/618 |
| 5,413,962 | 5/1995 | Lur et al. | 438/619 |
| 5,426,072 | 6/1995 | Finnila | 438/107 |
| 5,444,015 | 8/1995 | Aitken et al. | 438/618 |
| 5,451,804 | 9/1995 | Lur et al. | 257/330 |
| 5,462,884 | 10/1995 | Taniguchi | 438/286 |
| 5,488,015 | 1/1996 | Havemann et al. | 438/624 |
| 5,498,571 | 3/1996 | Mori et al. | 438/624 |
| 5,512,775 | 4/1996 | Cho | 257/522 |
| 5,545,919 | 8/1996 | Ueda et al. | 287/641 |
| 5,559,049 | 9/1996 | Cho | 438/304 |
| 5,559,055 | 9/1996 | Chang et al. | 438/586 |
| 5,567,982 | 10/1996 | Bartelink | 257/276 |
| 5,641,712 | 6/1997 | Grivna et al. | 438/624 |

(List continued on next page.)

FOREIGN PATENT DOCUMENTS

| | | |
|---|---|---|
| 63-179548 | 7/1988 | (JP) . |
| 1-296641 | 11/1989 | (JP) . |
| 5-206120 | 8/1993 | (JP) . |
| 5-335475 | 12/1993 | (JP) . |

OTHER PUBLICATIONS

Wolf, "Silicon Processing for the VLSI Era—vol. 2," 1990 Ed., pp. 198.

*Primary Examiner*—Stephen D. Meier
*Assistant Examiner*—Jeff Vockrodt
(74) *Attorney, Agent, or Firm*—Kevin L. Draffer; Conley, Rose & Tayon

(57) ABSTRACT

A reduced permittivity interlevel dielectric in a semiconductor device arranged between two levels of interconnect. The dielectric comprises a first dielectric layer preferably from a silane source deposited on a first level interconnect to form air gaps at midpoints between adjacent first interconnect structures, a second dielectric containing air gap trenches at spaced intervals across the second dielectric, and a third dielectric formed upon said second dielectric. A second interconnect level is formed on the third dielectric.

21 Claims, 4 Drawing Sheets

U.S. PATENT DOCUMENTS

| | | | |
|---|---|---|---|
| 5,646,067 | 7/1997 | Gaul | 438/458 |
| 5,665,632 | 9/1997 | Lur et al. | 438/422 |
| 5,710,079 | 1/1998 | Sukharev | 438/778 |
| 5,716,861 | 2/1998 | Moslehi | 438/231 |
| 5,736,446 | 4/1998 | Wu | 438/305 |
| 5,741,736 | 4/1998 | Orlowski | 438/286 |
| 5,759,913 | 6/1998 | Fulford, Jr. et al. | 438/624 |
| 5,770,507 | 6/1998 | Chen et al. | 438/305 |
| 5,783,864 | 7/1998 | Dawson et al. | 257/758 |
| 5,792,706 * | 8/1998 | Michael et al. | 438/626 |
| 5,814,555 | 9/1998 | Bandyopadhyay et al. | 438/619 |
| 5,832,601 | 11/1998 | Eldridge et al. | 29/843 |
| 5,847,464 | 12/1998 | Singh et al. | 257/752 |
| 5,869,374 | 2/1999 | Wu | 438/291 |
| 5,869,379 | 2/1999 | Gardner et al. | 438/305 |
| 5,900,668 * | 5/1999 | Wollesen | 257/522 |
| 5,953,626 | 9/1999 | Hause et al. | 438/622 |
| 5,959,337 | 9/1999 | Gardner et al. | 257/410 |
| 5,994,776 * | 7/1999 | Fang et al. | 257/758 |
| 5,998,293 | 12/1999 | Dawson et al. | 438/619 |

\* cited by examiner

INTERLEVEL DIELECTRIC WITH AIR GAPS TO LESSEN CAPACITIVE COUPLING

This is a Division of application Ser. No. 08/658,456, filed Jun. 5, 1996.

BACKGROUND OF THE INVENTION

1. Field of the Invention

This invention relates to semiconductor fabrication and more particularly to a dielectric material placed between semiconductor interconnect lines on the same or on different levels such that the dielectric contains air gaps and trenches arranged between interconnect lines. The air gaps or trenches are void of dielectric thereby decreasing the overall permittivity of the interlevel or interlayer dielectric.

2. Description of the Relevant Art

An integrated circuit includes numerous conductors extending across the topography of a monolithic substrate. A set of interconnect lines (or conductors) which serve to electrically connect two or more components within a system is generally referred to as a "bus". A collection of voltage levels are forwarded across the conductors to allow proper operation of the components. For example, a microprocessor is connected to memories and input/output devices by certain bus structures. There are numerous types of busses which are classified according to their operation. Examples of well-known types of busses include address busses, data busses and control busses.

Conductors within a bus generally extend parallel to each other across the semiconductor topography. The conductors are isolated from each other and from underlying conductive elements by a dielectric, a suitable dielectric being, for example, silicon dioxide ("oxide"). Conductors are thereby lithography patterned across the semiconductor topography, wherein the topography comprises a substrate with a dielectric placed thereon. The topography can also include one or more layers of conductors which are sealed by an upper layer of dielectric material. Accordingly, the layers of conductors overlayed with a dielectric present a topography upon which a subsequent layer of conductors can be patterned.

Conductors are made from an electrically conductive material. Suitable materials may include Al, Ti, Ta, W, Mo, polysilicon, or a combination thereof. Suitable substrates may include any type of material which can retain dopant ions and the isolated conductivity regions brought about by those ions. Typically, the substrate is a silicon-based material which receives p-type or n-type ions.

Generally speaking, interconnect lines (or conductors) are fashioned upon the topography and spaced above an underlying conductor or substrate by a dielectric of thickness $T_{d1}$. Each conductor is dielectrically spaced from other conductors within the same level of conductors by a distance $T_{d2}$. Accordingly, conductor-to-substrate capacitance $C_{LS}$ (i.e., capacitance between conductors on different levels) is determined as follows:

$$C_{LS} \approx \epsilon W_L L / T_{d1} \quad (1)$$

Further, the conductor-to-conductor capacitance $C_{LL}$ (i.e., capacitance between conductors on the same level) is determined as follows:

$$C_{LL} \approx \epsilon T_c L / T_{d2} \quad (2)$$

, where $\epsilon$ is the permittivity of the dielectric material (the dielectric material between the conductor and substrate or the dielectric material between conductors), $W_L$ is the conductor width, $T_c$ is the conductor thickness, and L is the conductor length. Resistance of the conductor is calculated as follows:

$$R = (\rho L) / W_L T_c \quad (3)$$

, where $\rho$ represents resistivity of the conductive material, and $T_c$ is the interconnect thickness. Combinations of equations 1 and 3, and/or equations 2 and 3 indicate the propagation delay of a conductor as follows:

$$RC_{LS} \approx \rho \epsilon L^2 / T_c T_{d1}$$

$$RC_{LL} \approx \rho \epsilon L^2 / W_L T_{d2}$$

Propagation delay is an important characteristic of an integrated circuit since it limits the speed (frequency) at which the circuit or circuits can operate. The shorter the propagation delay, the higher the speed of the circuit or circuits. It is therefore important that propagation delay be minimized as much as possible within the geometric constraints of the semiconductor topography.

Propagation delay is a function of both capacitance $C_{LS}$ as well as capacitance $C_{LL}$. Accordingly, propagation delay is determined by parasitic capacitance values ($C_{LL}$) between laterally spaced conductors, and parasitic capacitance values ($C_{LS}$) between vertically spaced conductors or between a conductor and the underlying substrate. As circuit density increases, lateral spacing between conductors decrease and capacitance $C_{LL}$ increases. Meanwhile, planarization mandates to some extent a decrease in vertical spacing. Shallow trench processing, recessed LOCOS processing, and multi-layered interlevel dielectrics bring about an overall reduction in vertical spacing and therefore an increase in $C_{LS}$. Integrated circuits which employ narrow interconnect spacings thereby define $C_{LL}$ as a predominant capacitance, and integrated circuits which employ thin interlevel dielectrics define $C_{LS}$ as a predominant capacitance.

It is thereby important to minimize propagation delay especially in the critical speed path. Given the constraints of chemical compositions, it is not readily plausible to reduce the resistivity $\rho$ of conductor materials. Geometric constraints make it difficult to increase conductor thickness $T_c$ or dielectric thickness $T_{d1}$ or $T_{d2}$. Still further, instead of reducing length L of a conductor, most modern integrated circuits employ long interconnect lines which compound the propagation delay problems. Accordingly, a need arises for instituting a reduction in propagation delay but within the chemical and geometric constraints of existing fabrication processes. It is therefore desirable that a fabrication process be developed which can reduce propagation by reducing the permittivity $\epsilon$ of dielectric material. More specifically, the desired process must be one which reduces the permittivity of dielectric material arranged between horizontally displaced or vertically displaced conductors. As such, it would be desirable to employ a fabrication technique in which dielectrics between conductors achieve low permittivity.

SUMMARY OF THE INVENTION

The problems outlined above are in large part addressed by a dielectric fabrication process that produces a low permittivity between the interconnect lines of a first interconnect level ("intra-level permittivity") and between the interconnect lines of a first interconnect level and the interconnect lines of a second interconnect level ("interlevel permittivity"). To reduce the intra-level permittivity, one embodiment of the process utilizes a first interconnect etch technique followed by an oxide formation technique that purposedly forms air gaps between closely spaced interconnect lines. A first interconnect level, preferably comprised of aluminum, is deposited on a wafer topography and then plasma etched in a chamber purposely depleted of polymers that would otherwise form passivating layers on the side walls of the interconnect. This etch technique results in a first interconnect that is "re-entrant" or undercut in the regions adjacent to the semiconductor topography. Next, a dielectric is deposited on the first interconnect. Preferably the dielectric is comprised of a silane source CVD oxide deposited at atmospheric pressure, or PECVD oxide deposited at low pressure. Deposition of these oxides upon sidewall re-entrant angles of the first interconnect produces poor coverage and therefore voids or air gaps are produced between the interconnect lines spaced close to one another. The oxide deposition process may be modified to enhance to air gap formation, if necessary.

Because the permittivity of air is less than the permittivity of a semiconductor dielectric, formation of an air gap within the dielectric causes a decrease in overall permittivity between interconnects. Reduction in the intra-level permittivity results in a reduction in the line-to-line capacitance $C_{LL}$. Reduction in $C_{LL}$ is shown to reduce intra-level propagation delay $RC_{LL}$. Formation of the air gap thereby reduces propagation delay and proves beneficial in meeting speed requirements within critical path interconnect lines, possibly interconnect lines spaced adjacent each other within a bus structure.

To reduce the inter-level permittivity, an improved process forms a multi-layered dielectric between first and second interconnect levels. After formation of the first dielectric layer described above, an intermediate dielectric layer is formed upon the first dielectric layer. Alternatively, the intermediate (or second dielectric) can be formed in-situ as part of the first dielectric—as merely an extension of the first dielectric. Next, portions of the intermediate dielectric layer are removed at spaced intervals across the intermediate dielectric layer, preferably in a plasma etch. A capping dielectric layer is then formed on top of the intermediate dielectric layer and a second interconnect level can then be deposited on the capping dielectric layer. The removal of portions of the intermediate dielectric creates air gap "trenches" in the inter-level dielectric structure that reduce the permittivity of the structure, thereby reducing $C_{LS}$.

Broadly speaking, the present invention contemplates a multi-layered dielectric formed between a pair of integrated circuit interconnects. A first integrated circuit interconnect layer is arranged upon a semiconductor topography. After the first interconnect level is formed, portions of the interconnect are removed to form a spaced set of interconnect conductors. The removal of the interconnect is achieved preferably with a plasma etch that purposely creates an undercut region at the periphery of each interconnect conductor. A conformal dielectric such as a dielectric formed from a silane source at atmospheric pressure is then deposited on the first interconnect level. The combination of the conformal oxide and the undercut conductors results in the formation of an intra-level air gap in the dielectric at points between closely spaced metal conductors. An intermediate dielectric is deposited upon the first dielectric. Portions of the intermediate dielectric are then removed at spaced intervals across the dielectric. Removal of the intermediate dielectric is preferably accomplished with a plasma etch process. A capping dielectric is next deposited on the intermediate dielectric. After deposition of the capping dielectric, a second layer of interconnect is then formed on the capping dielectric. In one embodiment, the method also includes the step of forming contact openings through the first intermediate, and capping dielectrics to at least one of the first level of interconnects. In one embodiment, the method further includes spacing the contact openings from the removed portions of the intermediate dielectric.

The present invention further contemplates an inter-level dielectric formed between two interconnect levels wherein the dielectric comprises a first dielectric formed upon a first level interconnect. A second dielectric having a plurality of trenches is formed upon the first level dielectric. A third dielectric is formed upon the second dielectric. Upon this inter-level dielectric, a second set of conductors is formed.

The first dielectric is preferably deposited in a chemical vapor deposition (CVD) process maintained substantially near atmospheric pressure, or in a PECVD process at low pressure. The first dielectric is preferably composed of nitride, oxynitride, or silicon dioxide.

BRIEF DESCRIPTION OF THE DRAWINGS

Other objects and advantages of the invention will become apparent upon reading the following detailed description and upon reference to the accompanying drawings in which.

Figure 1:
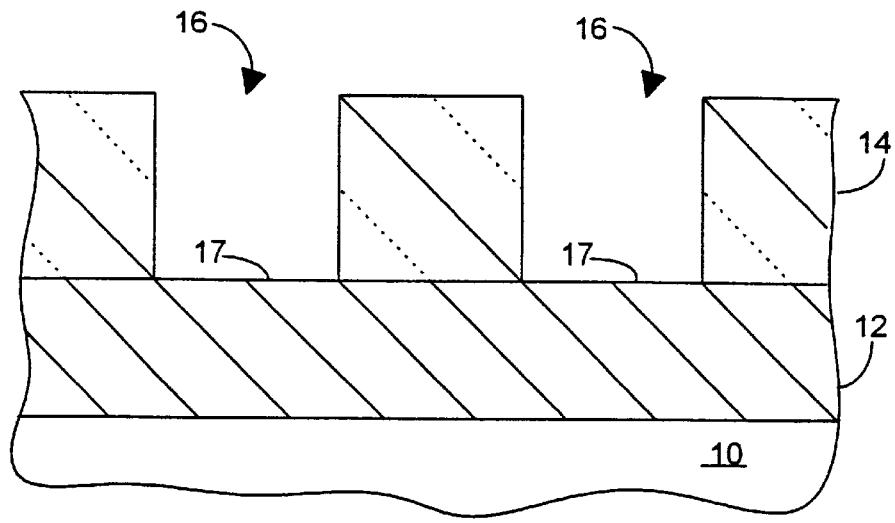
FIG. 1 is a partial cross-sectional view of a semiconductor topography having a first layer of interconnect formed thereon and a patterned photoresist layer on top.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to the drawings, FIG. 1 shows a first level interconnect 12 formed upon semiconductor topography 10 and photoresist layer 14 formed upon interconnect 12. First interconnect level 12 is preferably formed by a physical vapor deposition (PVD) process using an aluminum target. Openings 16 have been patterned in photoresist 14 with a photo-lithography step using a first interconnect mask having a pattern. After openings 16 have been created in photoresist layer 14, exposed interconnect 17 is then removed in an interconnect etch process.

Figure 2:
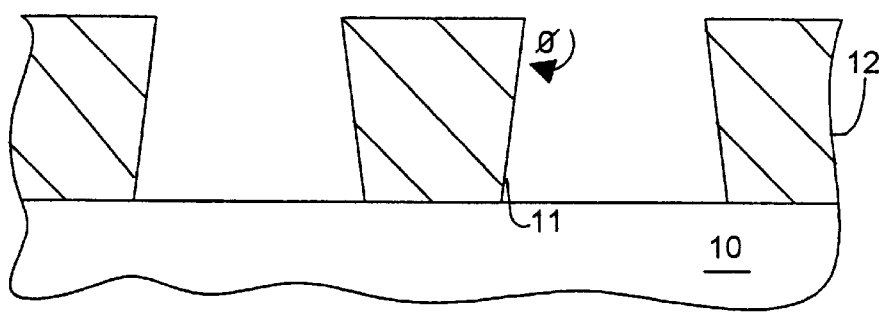
FIG. 2 is a processing step subsequent to that shown in FIG. 1, in which portions of the first level of metal have been removed in such a manner as to leave undercut regions at the periphery of each set of metal conductors.

FIG. 2 depicts first interconnect level 12 after the exposed interconnect level areas 17 have been removed. Removal of exposed interconnect area 17 is preferably accomplished with a plasma etch designed to create a re-entrant angle phi ($\phi$). Re-entrant angle $\phi$ is achieved by modifying conditions within the etch chamber reactor to form a re-entrant etch angle at the sidewall of each interconnect within interconnect level 12. FIG. 2 depicts undercut region 11 of interconnect level 12 proximal to wafer topography 10. In one embodiment, re-entrant angle $\phi$ is achieved by plasma etching interconnect 12 with a $BCl_3$ species in a chamber purposely depleted of polymers. Polymer-forming materials such as $CHCl_3$ or $CHF_3$ are commonly incorporated into interconnect etch processes to achieve an anisotropic etch. It is believed that the incorporation of a polymer into the interconnect etch process facilitates an anisotropic etch by forming inhibiting or passivating layers on the interconnect surface. These passivating layers are removed on the interconnect surfaces that are struck by energetic ions thereby allowing etch of the exposed interconnect in those regions. On the interconnect surfaces that are not struck by energetic ions however, the passivating layers are not removed and no etch results.

It is further believed that since the energetic ions tend to strike the wafer perpendicularly to the wafer surface, the aluminum etch proceeds anisotropically because the passivating layers are removed on the surfaces parallel to wafer topography 10, while surfaces perpendicular to wafer topography 10 (i.e. the sidewalls) remain unetched because few energetic ions capable of removing the passivating layer strike these surfaces. The creation of passivating sidewalls during an interconnect etch process is typically desirable because the passivating sidewalls result in an anisotropic etch and a perpendicular metal profile. Perpendicular profiles are desirable because subsequent dielectrics are more able to conform to perpendicular topography than to a re-entrant topography and because the perpendicular profile maximizes the cross-sectional area of the interconnect thereby reducing the current density.

Thus, it is not uncommon to add chloro-carbon gasses such as $CHCl_3$ to chlorine plasmas to reduce undercutting in conventional metal etch processes. Contrary to this preference however, the present invention, in one embodiment, purposely generates re-entrant angle $\phi$ in first interconnect 12 by depleting the etch chamber of polymers. Depleted of the polymers that assist formation of passivating sidewalls, the etch becomes isotropic and results in undercut regions 11 and a re-entrant interconnect profile.

Figure 3:
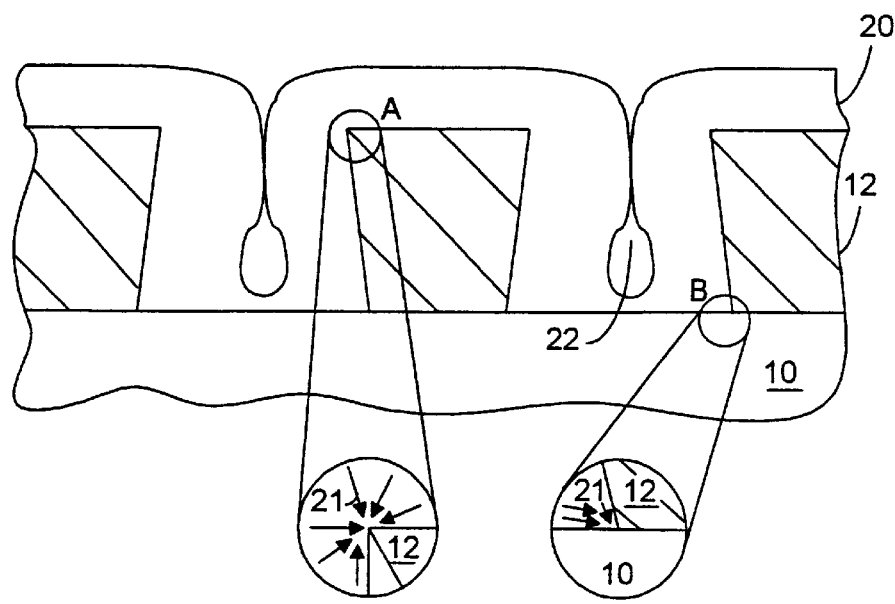
FIG. 3 is a processing step subsequent to that shown in FIG. 2, after formation of a first dielectric has been formed upon the first level of metal, whereby air gaps are formed at a mid-line between the first metal conductors.

FIG. 3 depicts a subsequent processing step wherein first dielectric layer 20 has been formed on first interconnect level 12 and wafer topography 10. First dielectric 20 is purposely formed to create voids 22 at midpoints between adjacent first interconnect level structures 12. Preferably, first dielectric 20 comprises a layer of silicon dioxide formed from a silane source in a low temperature, atmospheric pressure CVD or low pressure PECVD reactor. CVD and PECVD conditions are rendered conducive to the formation of voids because the deposition rate at any given point on the underlying topography is a function of the "arrival angle". Arrival angle refers to the range of angles from which reactant molecules can arrive at a given point on a topography. As an example, points on a flat surface have an arrival angle of 180°, while points on an exterior right angle have an arrival angle of 270°.

Under atmospheric pressure conditions, the mean free path of reactant gas molecules is short. The frequent collisions of gas molecules with each other randomizes the velocity vectors of each gas molecule. Under these conditions, the probability that a gas molecule is traveling in any given direction is independent of the direction. In other words, gas molecules in atmospheric pressure reactors are equally likely to be traveling in any given direction. The rate at which reactive molecules arrive at any given point is, therefore, a function of the arrival angle at the given point.

At the corner of first interconnect level 12 shown in exploded view "A" of FIG. 3, velocity vectors 21 represent active molecules arriving at the corner of interconnect 12 from angles of approximately 0° to 270°. In contrast, reactant molecules arrive at a corner shown in exploded view "B" of FIG. 3 in a much more limited range of angles. Because the arrival angle at corner A is greater than the arrival angle at corner B and because the reactant molecule velocity vectors are randomized, reactant molecules arrive at corner A at a greater rate than they arrive at corner B. The deposition rate of first dielectric 20 at corner A is, therefore, greater than the deposition rate at corner B. A higher deposition rate at point A results in a cusping of dielectric 20 which leads eventually to the formation of voids 22 at a midpoint between adjacent structures of interconnect level 12. Formation of voids 22 would be inhibited if the deposition of first dielectric 20 were performed at high temperature or at low pressure. Moreover, the use ozone ($O_3$) enhanced reactions should also be avoided because those sources tend to produce dielectrics which fill voids.

Figure 4:
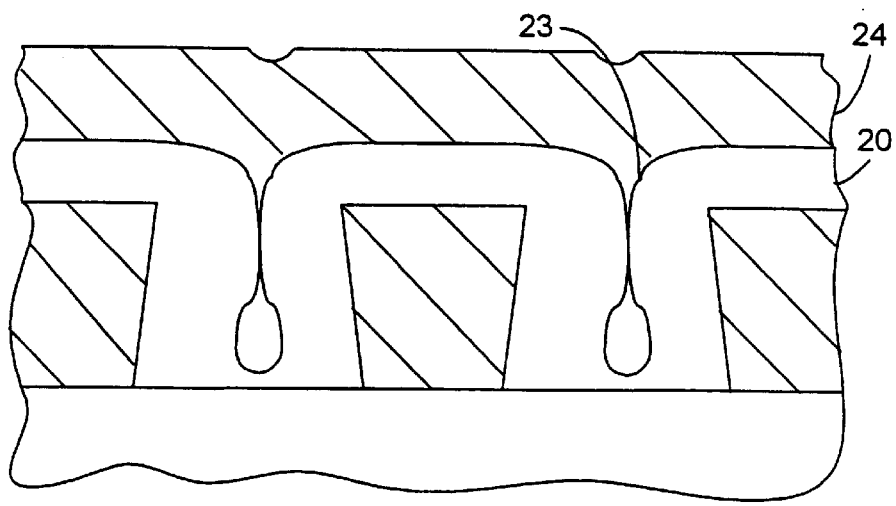
FIG. 4 is a processing step subsequent to that shown in FIG. 3, wherein a second dielectric has been formed upon the first dielectric.

Turning now to FIG. 4, a second or intermediate dielectric 24 is formed upon first dielectric 20. Formation of intermediate dielectric 24 can be accomplished using a CVD or PECVD reactor with a TEOS, ozone, or silane source. Alternatively, intermediate dielectric 24 can be comprised of a spin-on-glass (SOG). In either instance, certain forms of intermediate dielectric 24 can be produced merely as an extension of the first dielectric. Use of a flowable dielectric is preferred to fill in regions of non-planar topology 23. A plasma enhanced CVD dielectric formed from a TEOS source is an example of a dielectric suitable as intermediate dielectric 24.

Figure 5A:
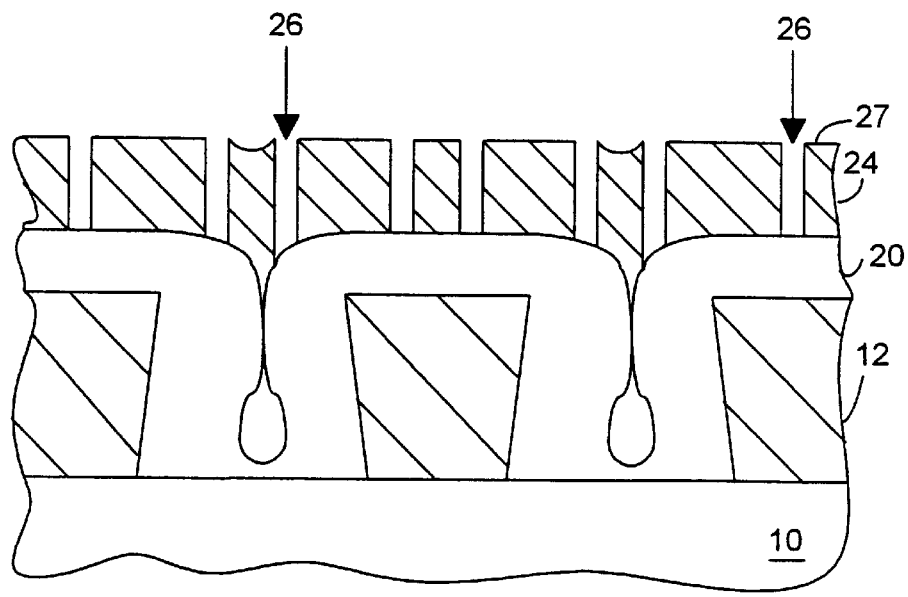
FIG. 5 is a processing step subsequent to that shown in FIG. 4, wherein portions of the second layer of dielectric have been removed at spaced intervals across the second dielectric.
Figure 5B:
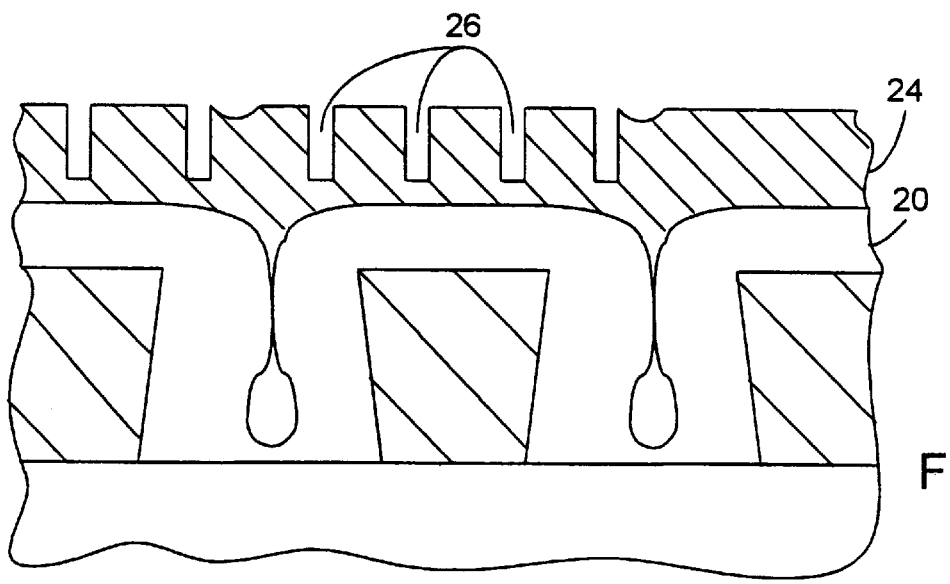

Turning now to FIG. 5A, portions of dielectric 24 are removed to form air gap trenches 26 in the dielectric structure. In one embodiment, trenches 26 are formed through the use of a masking step and a plasma etch. Trenches 26 are formed at spaced intervals across intermediate dielectric 24. In one embodiment, it is desirable to restrict the regions in which trenches 26 are formed. In regions of dielectric 24 wherein an inter-level via will be formed, it is desirable to suppress the formation of trenches 26. As shown in the drawing, no trenches 26 are formed in region 27 of intermediate dielectric 24 where a via will be subsequently formed. Generation of a mask in which trenches are suppressed in the vicinity of vias is accomplished by "exclusive-or-ing" the trench mask with the via mask. FIG. 5B shows an embodiment in which the depth of trenches 26 is less than the thickness of intermediate dielectric 24.

Figure 6:
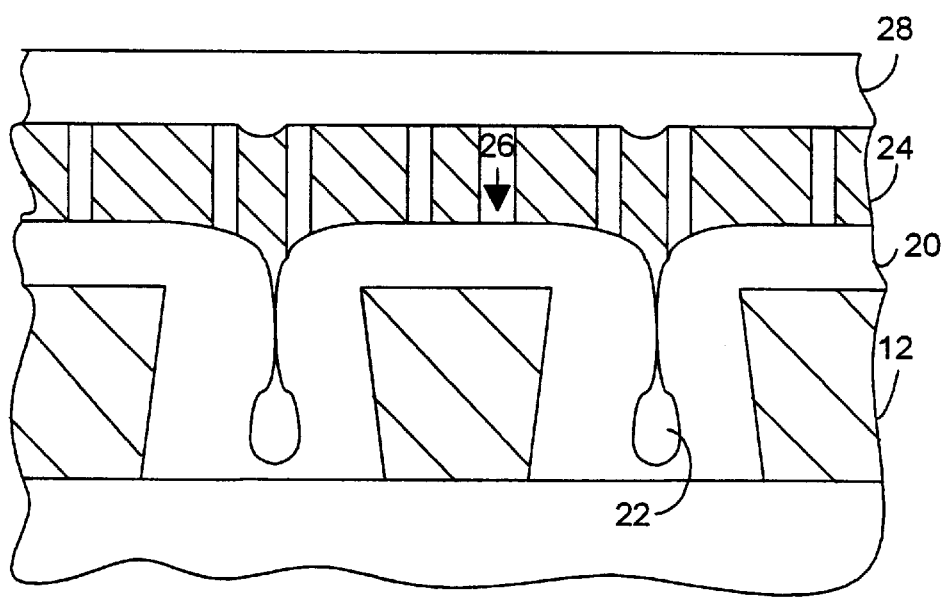
FIG. 6 is a processing step subsequent to that shown in FIG. 5, wherein a third dielectric has been formed upon the second dielectric.
Figure 7:
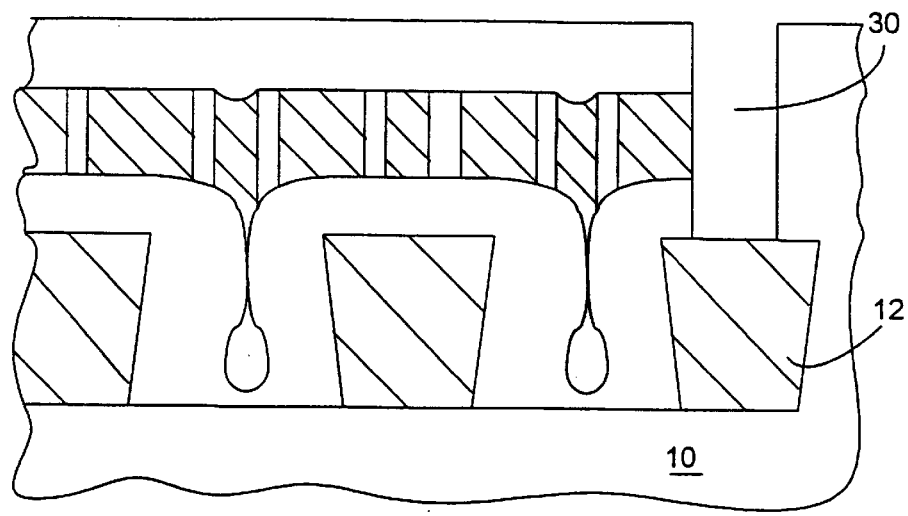
FIG. 7 is a processing step subsequent to that shown in FIG. 6, wherein a via has been formed by creating an opening through the first, second and third dielectrics to a first metal conductor.

Turning now to FIG. 6, a third dielectric 28 is formed upon intermediate dielectric 24. In one embodiment, third dielectric 28 is formed in a CVD reactor using a silane source. Third dielectric 28 provides a cap for trenches 26 such that subsequent deposition of an interconnect will not produce interconnect material in trenches 26. FIG. 7 depicts a subsequent process step in which a via 30 has been opened through first dielectric 20, intermediate dielectric 24, and third dielectric 28 over at least one first interconnect structure 12. Via 30 is preferably formed using a plasma etch process with a fluorocarbon plasma.

Figure 8:
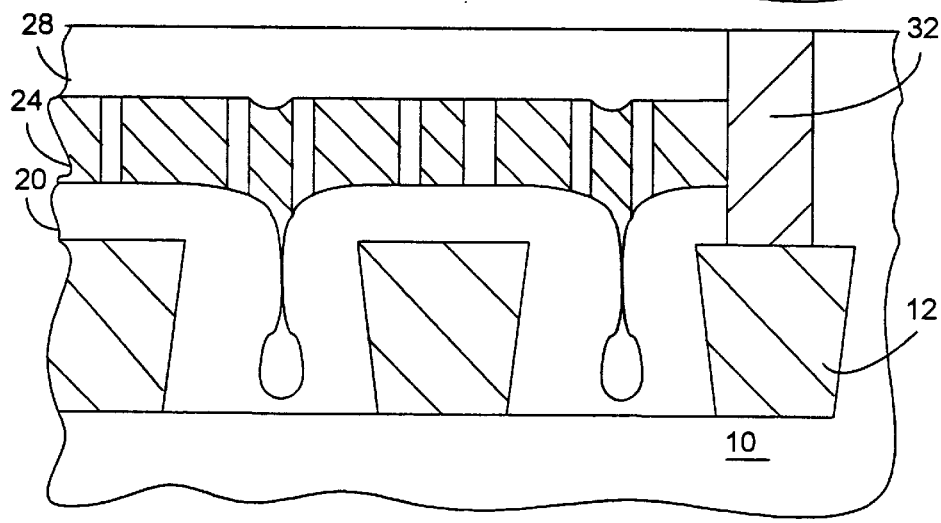
FIG. 8 is a processing step subsequent to that shown in FIG. 7, wherein the via has been filled with a conductive material.

Via 30 is then filled with conductive plug 32, as shown in FIG. 8. Plug 32 is preferably formed in a CVD reactor from a tungsten source gas such as tungsten hexafluoride ($WF_6$), but may also be CVD or PECVD aluminum or its alloys. Deep, narrow vias with substantially vertical sidewalls are common in semiconductor devices utilizing multiple interconnect levels. When such structures are present, the ability to deposit an interconnect level having adequate step coverage over the vias using a physical vapor deposition or sputter technique becomes difficult. Plug 32 is employed to overcome the step coverage limitations of sputtered films. In one embodiment, an adhesion layer is deposited to overcome tungsten's poor adhesion to dielectrics such as $SiO_2$. The adhesion layer is preferably comprised of a 1000 Å layer of TiN. Conformal tungsten is then deposited in a CVD reactor to fill via 30. After the blanket tungsten deposition step, excess tungsten is removed with an etchback technique or a chemical mechanical polish leaving tungsten in via 30 and removing tungsten elsewhere.

Figure 9:
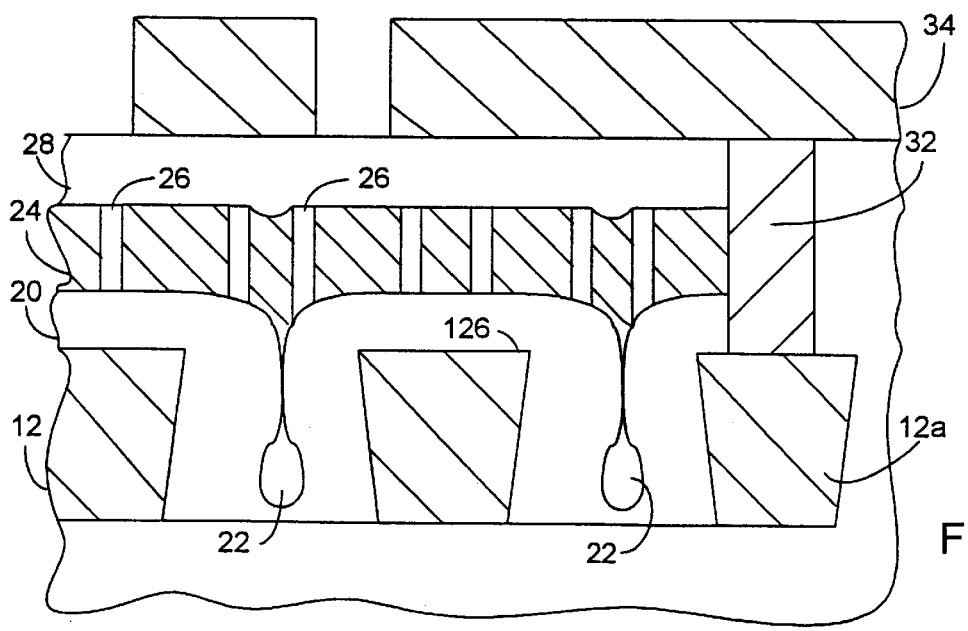
FIG. 9 is a processing step subsequent to that shown in FIG. 8, wherein a second level of interconnect has been formed upon the third dielectric and portions of the second interconnect have been removed.

FIG. 9 depicts second interconnect level 34 patterned upon third dielectric 28 and plug 32. As will be readily appreciated by those skilled in the art, FIG. 9 depicts a inter-level dielectric comprised of a first dielectric 20 having air gaps 22 at midpoints between adjacent interconnect 12, intermediate dielectric 24 containing a plurality of trenches 26, and third dielectric 28. Because the permittivity of the air in trenches 26 is less than the permittivity of dielectric 24, the inter-level permittivity is reduced by the presence of trenches 26. Moreover, air gap 22 in first dielectric 20 reduces the intra-level permittivity between adjacent first interconnect structures shown in the figure as 12a and 12b. The reduced permittivity of the dielectric structure shown in FIG. 9 results in a reduced level-to-level capacitance $C_{LL}$ and level-to-substrate capacitance $C_{LS}$. As will be appreciated by those skilled in the art, the reduced inter-level and intra-level capacitance of the dielectric structure shown in FIG. 9 reduces propagation delays and improves circuit and device performance.

It will be appreciated to those skilled in the art of semiconductor design and manufacturing having the benefit of this disclosure that this invention is generally useful in providing an interconnect level designed to reduce intralevel capacitive coupling. It is to be understood that the form of the invention shown and described in the detailed description and the drawings is to be taken merely as presently preferred examples of how a low permittivity dielectric can be integrated into a interconnect formation process to reduce intralevel capacitive coupling. Obvious variations of the method disclosed would be apparent to those skilled in the art having the benefit of this disclosure. For example, formation of first interconnect level 12 and second interconnect level 34 could comprise a multilayer structure or an alloy. It is intended the following claims be interpreted broadly to embrace all of these variations of the preferred embodiments disclosed.

What is claimed is:

1. An interlevel dielectric arranged between two levels of interconnect, comprising:
    a first dielectric configured upon and between a first set of conductors which comprise a first level of interconnect, wherein said first dielectric comprises voids disposed within said first dielectric between said first set of conductors;
    a plurality of trenches spaced from each other across a second dielectric which is configured upon said first dielectric;
    a third dielectric arranged over said trenches; and
    a second set of conductors which comprise a second level of interconnect formed upon said third dielectric.

2. The interlevel dielectric as recited in claim 1, further comprising a contact formed through said first, second and third dielectrics.

3. The interlevel dielectric as recited in claim 2, wherein said contact is configured a spaced distance from said trenches.

4. The interlevel dielectric as recited in claim 1, wherein each of said trenches comprise a depth less than the thickness of said second dielectric.

5. The interlevel dielectric as recited in claim 1, wherein each of said trenches comprise a depth substantially equal to the thickness of said second dielectric.

6. The interlevel dielectric as recited in claim 1, wherein said trenches comprise air.

7. The interlevel dielectric as recited in claim 1, wherein said voids comprise air.

8. The interlevel dielectric as recited in claim 1, wherein said first dielectric comprises a material selected from the group consisting of silicon oxide, silicon nitride and silicon oxynitride.

9. The interlevel dielectric as recited in claim 1, wherein said first dielectric comprises a conformal dielectric, wherein said conformal dielectric is formed from a silane source at atmospheric pressure.

10. The interlevel dielectric as recited in claim 1, wherein said second dielectric comprises a material selected from the group consisting of silicon oxide, spin-on-glass, or a flowable dielectric.

11. The interlevel dielectric as recited in claim 1, wherein said first set of conductors comprises interconnects, and wherein said interconnects have an undercut region adjacent to the semiconductor topography and a re-entrant interconnect profile.

12. An interlevel dielectric comprising:
    a first layer of dielectric material with voids disposed therein;
    a second layer of dielectric material with intermittent trenches placed therein, wherein said trenches extend partially between two levels of interconnect; and
    a contact formed between the two levels of interconnect a spaced distance from said trenches.

13. The interlevel dielectric as recited in claim 12, wherein at least one of said trenches extend partially between a conductor arranged upon one level of interconnect and a conductor arranged upon another level of interconnect.

14. The interlevel dielectric as recited in claim 12, wherein said voids comprise air.

15. The interlevel dielectric as recited in claim 12, wherein said first layer of dielectric material comprises a material selected from the group consisting of silicon oxide, silicon nitride and silicon oxynitride.

16. The interlevel dielectric as recited in claim 12, wherein said first layer of dielectric material comprises a conformal dielectric, wherein said conformal dielectric is formed from a silane source at atmospheric pressure.

17. The interlevel dielectric as recited in claim 12, wherein said second layer of dielectric material comprises a material selected from the group consisting of silicon oxide, spin-on-glass, or a flowable dielectric.

18. The interlevel dielectric as recited in claim 12, wherein one of the two levels of interconnect comprises interconnects, and wherein said interconnects have an undercut region adjacent to the semiconductor topography and a re-entrant interconnect profile.

19. An interlevel dielectric comprising:
   a first layer of dielectric material with voids disposed therein; and
   a second layer of dielectric material with intermittent trenches placed therein, wherein said trenches extend partially between two levels of interconnect and wherein said trenches comprise air.

20. The interlevel dielectric as recited in claim 19, wherein said voids comprise air.

21. The interlevel dielectric as recited in claim 20, wherein at least one of said trenches extend partially between a conductor arranged upon one level of interconnect and a conductor arranged upon another level of interconnect.

\* \* \* \* \*